(12) United States Patent
Ruan et al.

(10) Patent No.: US 11,619,679 B2
(45) Date of Patent: Apr. 4, 2023

(54) METHOD, APPARATUS AND MEDIUM FOR ESTIMATING BATTERY REMAINING LIFE

(71) Applicant: Jiangsu Contemporary Amperex Technology Limited, Changzhou (CN)

(72) Inventors: Jian Ruan, Changzhou (CN); Mingshu Du, Changzhou (CN); Shenzhi Tang, Changzhou (CN); Shichao Li, Changzhou (CN); Yanhua Lu, Changzhou (CN); Wei Zhang, Changzhou (CN)

(73) Assignee: Jiangsu Contemporary Amperex Technology Limited, Changzhou (CN)

( * ) Notice: Subject to any disclaimer, the term of this patent is extended or adjusted under 35 U.S.C. 154(b) by 0 days.

(21) Appl. No.: 17/566,705

(22) Filed: Dec. 31, 2021

(65) Prior Publication Data

US 2022/0120821 A1 Apr. 21, 2022

Related U.S. Application Data

(63) Continuation of application No. PCT/CN2020/138712, filed on Dec. 23, 2020.

(30) Foreign Application Priority Data

Aug. 11, 2020 (CN) .......................... 202010798925.0

(51) Int. Cl.
  *G01R 31/392* (2019.01)
  *G01R 31/3842* (2019.01)
  *G01R 31/36* (2020.01)

(52) U.S. Cl.
  CPC ....... *G01R 31/392* (2019.01); *G01R 31/3648* (2013.01); *G01R 31/3842* (2019.01)

(58) Field of Classification Search
  None
  See application file for complete search history.

(56) References Cited

U.S. PATENT DOCUMENTS

| 10,371,753 B1 * | 8/2019 | Wang ..................... H01M 10/48 |
| 2005/0189920 A1 * | 9/2005 | Koch ................... G01R 31/367 |
| | | 320/132 |

(Continued)

FOREIGN PATENT DOCUMENTS

| CN | 103364732 A | 10/2013 |
| CN | 105158696 A | 12/2015 |

(Continued)

OTHER PUBLICATIONS

The International search report for PCT Application No. PCT/CN2020/138712, dated May 8, 2021, 14 pages.

(Continued)

*Primary Examiner* — Brent A. Fairbanks
(74) *Attorney, Agent, or Firm* — East IP P.C.

(57) ABSTRACT

The embodiments of the present application disclose a method, apparatus and medium for estimating a battery remaining life and relates to the field of battery power. The method includes: acquiring a material aging parameter of a battery representing an aging degree of a material of the battery; and determining, based on a preset corresponding relationship between the material aging parameter and the battery remaining life, the battery remaining life corresponding to the material aging parameter.

11 Claims, 2 Drawing Sheets

(56) References Cited

U.S. PATENT DOCUMENTS

| | | | | |
|---|---|---|---|---|
| 2015/0153424 A1* | 6/2015 | Kanada | ............... | G01R 31/389 324/430 |
| 2015/0229150 A1* | 8/2015 | Nakamori | ............... | H02J 7/00 320/134 |
| 2017/0082694 A1* | 3/2017 | Yonemoto | ........... | H01M 10/486 |
| 2020/0150183 A1* | 5/2020 | Yoon | .................... | G01R 31/367 |

FOREIGN PATENT DOCUMENTS

| | | |
|---|---|---|
| CN | 106383324 A | 2/2017 |
| CN | 106814320 A | 6/2017 |
| CN | 107271610 A | 10/2017 |
| CN | 107356877 A | 11/2017 |
| CN | 108375624 A | 8/2018 |
| CN | 108427074 A | 8/2018 |
| CN | 108896913 A | 11/2018 |
| CN | 109164396 A | 1/2019 |
| CN | 109613438 A | 4/2019 |
| CN | 110045293 A | 7/2019 |
| CN | 110133527 A | 8/2019 |
| CN | 110618387 A | 12/2019 |
| CN | 110954832 A | 4/2020 |
| CN | 111048857 A | 4/2020 |
| CN | 111208431 A | 5/2020 |
| CN | 111707955 A | 9/2020 |
| DE | 102009002496 A1 | 10/2010 |
| DE | 102019007510 A1 | 7/2020 |
| EP | 2899837 A1 | 7/2015 |
| EP | 3930075 A1 | 12/2021 |

OTHER PUBLICATIONS

The First Office Action for China Application No. 202010798925.0, dated Oct. 9, 2020, 24 pages.

Yang Peng et al. Research progress of capacity fade of Li-ion batteries. Chinese Journal of Power Sources, vol. 39, No. 5, p. 1083-1090, dated Dec. 31, 2015.

Tingting Wang. Development and Application of Multifactorial Aging Model for Lithium-Ion Battery. China Master's Theses Full-text Database Engineering science and technology II series, No. 2, Paragraph 30-38, dated Feb. 15, 2016.

John Wang et al. Degradation of lithium ion batteries employing graphite negatives and nickelecobaltemanganese oxide þ spinel manganese oxide positives: Part 1, aging mechanisms and life estimation. Journal of Power Sources, p. 937-948, dated Dec. 31, 2014.

Elisabeth M. Börger et al. Aging of ceramic coated graphitic negative and NCA positive electrodes in commercial lithium-ion battery cells—An ex-situ study of different states of health for identification and quantification of aging influencing parameters. Journal of Energy Storage, p. 304-312, dated Dec. 31, 2017.

Pentus Svens et al. Analysis of aging of commercial composite metal oxide e Li4Ti5O12 battery cells. Journal of Power Sources, p. 131-141, dated Dec. 31, 2014.

The extended European search report for European Application No. 20925005.9 , dated May 11, 2022, 7 pages.

\* cited by examiner

METHOD, APPARATUS AND MEDIUM FOR ESTIMATING BATTERY REMAINING LIFE

CROSS-REFERENCE TO RELATED APPLICATIONS

The present application is a continuation of International Application No. PCT/CN2020/138712, filed on Dec. 23, 2020, which claims priority to Chinese patent application No. 202010798925.0, entitled "METHOD, APPARATUS AND MEDIUM FOR ESTIMATING BATTERY REMAINING LIFE", filed on Aug. 11, 2020, both of which are incorporated herein by reference in their entireties.

TECHNICAL FIELD

The present application relates to the field of battery technology, and in particular, to a method, apparatus and medium for estimating a battery remaining life.

BACKGROUND

With the development of new energy, more and more fields utilize new energy as power. For advantages such as high energy density, recyclable charging, safety and environmental protection, batteries are widely used in new energy vehicles, energy storage systems and other fields. Due to the gradual aging of the battery as the service life, the service mileage or the cycle number of charging and the like of the battery increase, the battery remaining life gradually decreases. Therefore, the battery remaining life can be used as an important criterion for determining the use value of the battery, and is one of the battery current state parameters that users concern about.

However, currently the battery remaining life is usually evaluated as a whole by training models, which fails to consider the difference between individual batteries and cannot accurately evaluate the battery remaining life. Therefore, a method that is able to accurately evaluate the battery remaining life is needed.

SUMMARY

The embodiments of the present application provide a method, apparatus, device and medium for estimating a battery remaining life to evaluate the battery remaining life for an individual battery according to the material aging parameter of the individual battery.

In a first aspect, a method for estimating a battery remaining life is provided, comprising: acquiring a material aging parameter of a battery representing an aging degree of a material of the battery; determining, based on a preset corresponding relationship between the material aging parameter and the battery remaining life, the battery remaining life corresponding to the material aging parameter; wherein the material aging parameter comprises: a first aging parameter representing an aging degree of electrode active material of the battery, and/or a second aging parameter representing an aging degree of active ions of the battery; wherein the first aging parameter comprises: a positive electrode aging parameter representing an aging degree of positive electrode active material of the battery, and/or a negative electrode aging parameter representing an aging degree of negative electrode active material of the battery.

In an optional implementation, the corresponding relationship comprises: a first corresponding relationship between the material aging parameter and a material concentration change, and a second corresponding relationship between the material concentration change and the battery remaining life, the determining, based on a preset corresponding relationship between the material aging parameter and the battery remaining life, the battery remaining life corresponding to the acquired material aging parameter comprises: determining a current material concentration change corresponding to the material aging parameter based on the first corresponding relationship; and determining the battery remaining life corresponding to the current material concentration change using the second corresponding relationship.

In an optional implementation, under a condition that the material aging parameter comprises the positive electrode aging parameter, the battery remaining life comprises a current remaining life of the positive electrode active material; under a condition that the material aging parameter comprises the negative electrode aging parameter, the battery remaining life comprises a current remaining life of the negative electrode active material; and under a condition that the material aging parameter comprises the second aging parameter, the battery remaining life comprises a current remaining life of the active ions.

In an optional implementation, the material aging parameter comprises at least two aging parameters among the positive electrode aging parameter, the negative electrode aging parameter, and the second aging parameter; the determining, based on a preset corresponding relationship between the material aging parameter and the battery remaining life, the battery remaining life corresponding to the material aging parameter comprises: determining the battery remaining life as a minimum value of current remaining lives respectively corresponding to the at least two aging parameters.

In an optional implementation, the material aging parameter comprises the positive electrode aging parameter representing the aging degree of positive electrode active material of the battery, the negative electrode aging parameter representing the aging degree of negative electrode active material of the battery, and the second aging parameter representing the aging degree of active ions of the battery; the acquiring the material aging parameter of the battery comprises: acquiring a plurality of sets of first pending data within a preset time period, wherein each set of the first pending data comprises a battery open circuit voltage (OCV) under a quasi-stationary working condition, and a cumulative net charging and discharging capacity (Q) corresponding to the OCV; determining a first current state of charge (SOC) corresponding to a current Q in each set of the first pending data by use of a first corresponding relationship function of the Q and a current SOC, and constructing a corresponding relationship between the OCV in each set of the first pending data and the first current SOC so as to obtain a plurality of corresponding sets of the OCV and the first current SOC, wherein a corresponding relationship coefficient of the Q and the current SOC in the first corresponding relationship function is a capacity aging parameter; acquiring a plurality of sets of second pending data, wherein each set of the second pending data comprises a positive electrode potential of the battery at a beginning of life and operating under the quasi-stationary working condition, and an initial SOC corresponding to the positive electrode potential; determining a second current SOC corresponding to the initial SOC in each set of the second pending data by use of a second corresponding relationship function of the initial SOC and the current SOC, and constructing a corresponding relationship between the positive electrode potential in each set of the second pending data and the second current SOC so as to obtain a plurality of corresponding sets of the positive electrode potential and the second current SOC, wherein a corresponding relationship coefficient of the initial SOC and the current SOC in the second corresponding relationship function is the positive electrode aging parameter; acquiring a plurality of sets of third pending data, wherein each set of the third pending data comprises a negative electrode potential of the battery at the beginning of life and operating under the quasi-stationary working condition, and an initial SOC corresponding to the negative electrode potential; determining a third current SOC corresponding to the initial SOC in each set of the third pending data by use of a third corresponding relationship function of the initial SOC and the current SOC, and constructing a corresponding relationship between the negative electrode potential in each set of the third pending data and the third current SOC so as to obtain a plurality of corresponding sets of the negative electrode potential and the third current SOC, wherein a corresponding relationship coefficient of the initial SOC and the current SOC in the third corresponding relationship function is the negative electrode aging parameter, and a constant term in the third corresponding relationship function is the second aging parameter; processing the plurality of corresponding sets of the positive electrode potential and the second current SOC and the plurality of corresponding sets of the negative electrode potential and the third current SOC to obtain a plurality of corresponding sets of the OCV and a fourth current SOC; and fitting the plurality of corresponding sets of the OCV and the first current SOC and the plurality of corresponding sets of the OCV and the fourth current SOC to obtain the capacity aging parameter, the second aging parameter, the positive electrode aging parameter, and the negative electrode aging parameter; wherein the quasi-stationary working condition comprises a working condition in which a duration during which the battery is charged with a current less than a preset current threshold reaches a first preset duration, or a current stationary duration of the battery is greater than a second preset duration.

In a second aspect, an apparatus for estimating a battery remaining life is provided, comprising:

an aging parameter acquiring module configured to acquire a material aging parameter of a battery representing an aging degree of a material of the battery; a remaining life estimating module configured to determine, based on a preset corresponding relationship between the material aging parameter and the battery remaining life, the battery remaining life corresponding to the material aging parameter; wherein the material aging parameter comprises: a first aging parameter representing an aging degree of electrode active material of the battery, and/or a second aging parameter representing an aging degree of active ions of the battery; wherein the first aging parameter comprises: a positive electrode aging parameter representing an aging degree of positive electrode active material of the battery, and/or a negative electrode aging parameter representing an aging degree of negative electrode active material of the battery.

In an optional implementation, the corresponding relationship comprises: a first corresponding relationship between the material aging parameter and a material concentration change, and a second corresponding relationship between the material concentration change and the battery remaining life, the remaining life estimating module comprises: a first determining unit configured to determine a current material concentration change corresponding to the material aging parameter based on the first corresponding relationship; and a second determining unit configured to determine the battery remaining life corresponding to the current material concentration change using the second corresponding relationship.

In a third aspect, a device for estimating a battery remaining life is provided, including: a memory storing a program; and a processor configured to operate the program stored in the memory to perform the method for estimating the battery remaining life provided by the first aspect or any one of the optional implementations of the first aspect.

In a fourth aspect, a computer storage medium storing computer program instructions thereon which implement, when executed by a processor, the method for estimating the battery remaining life provided by the first aspect or any one of the optional implementations of the first aspect is provided.

BRIEF DESCRIPTION OF THE DRAWINGS

In order to more clearly illustrate the technical solutions of the embodiments of the present application, the drawings to be used in the embodiments of the present application will be briefly introduced below. Obviously, the drawings described below are merely some embodiments of the present application, and for those of ordinary skill in the art, other drawings can be obtained based on these drawings without inventive effort.

DETAILED DESCRIPTION

The features and exemplary embodiments of various aspects of the present application will be described in detail below. In order to make the objectives, technical solutions, and advantages of the present application clearer, the present application will be further described in detail below with reference to the drawings and embodiments. It should be understood that the specific embodiments described herein are merely used to explain the present application, rather than to limit the present application. For those skilled in the art, the present application can be implemented without some of these specific details. The following description of the embodiments is merely to provide a better understanding of the present application by illustrating the examples of the present application.

It should be noted that, in the present application, relational terms, such as first and second, are used merely to distinguish one entity or operation from another entity or operation, without necessarily requiring or implying any actual such relationships or orders of these entities or operations. Moreover, the terms "comprise", "include", or any other variants thereof, are intended to represent a non-exclusive inclusion, such that a process, method, article or device including a series of elements includes not only those elements, but also other elements that are not explicitly listed or elements inherent to such a process, method, article or device. Without more constraints, the elements following an expression "comprise/include . . . " do not exclude the existence of additional identical elements in the process, method, article or device that includes the elements.

The embodiments of the present application provide a solution for estimating a battery remaining life, which can be applied to a scenario of calculating the battery remaining life. For example, the scenario may be a specific scenario where the remaining life of the vehicle battery is estimated when the vehicle is travelling.

Figure 1:
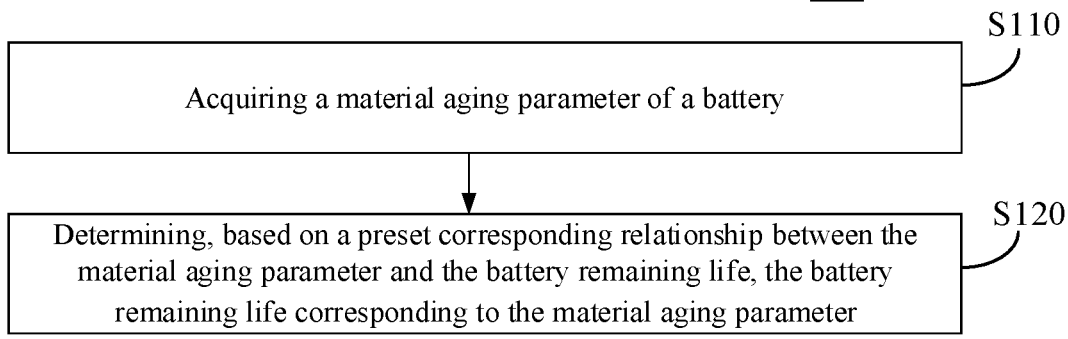
FIG. 1 is a schematic flowchart of a method for estimating a battery remaining life provided by the embodiments of the present application.

FIG. 1 is a schematic flowchart of a method for estimating a battery remaining life provided by the embodiments of the present application. As shown in FIG. 1, the method for estimating the battery remaining life 100 includes S110 and S120.

S110: acquiring a material aging parameter of a battery.

In S110, the material aging parameter represents an aging degree of a material of the battery.

Specifically, the material aging parameter includes: a first aging parameter representing an aging degree of electrode active material of the battery, and/or a second aging parameter representing an aging degree of active ions of the battery.

Firstly, the second aging parameter is used to represent the aging degree of the active ions in the battery. Taking a lithium battery as an example, the second aging parameter may be correlated with the active lithium loss in the battery.

In some embodiments, the aging degree of the active ions is positively correlated with the second aging parameter, that is, the greater the aging degree of the active ions, the greater the second aging parameter.

Figure 2:
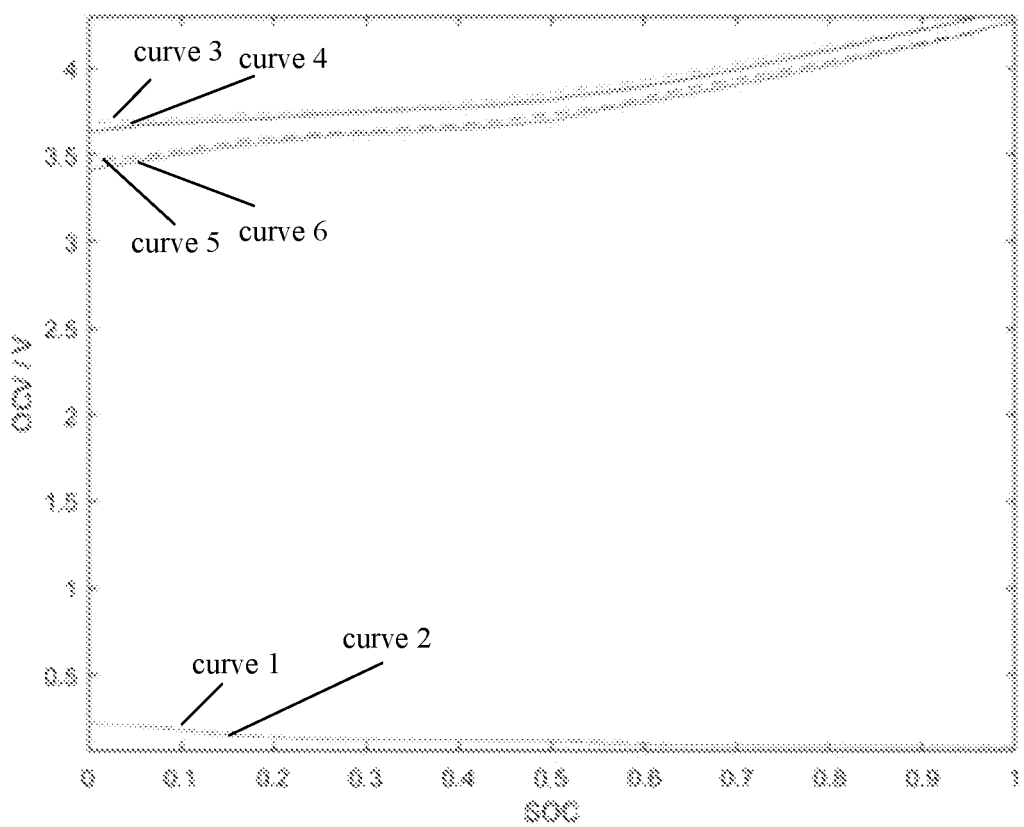
FIG. 2 is a diagram of a corresponding relationship between the voltage and the SOC of the battery provided by the embodiments of the present application.

The following parts of the embodiments of the present application will describe the second aging parameter in detail with reference to the drawings. FIG. 2 is a diagram of a corresponding relationship between the voltage and the state of charge (State of Charge, SOC) of the battery provided by the embodiments of the present application.

As shown in FIG. 2, curve 1 depicted with the dashed line is the correlation curve between the negative electrode potential OCVNeg and the SOC of the battery after aging, and curve 2 depicted with the solid line is the correlation curve between the negative electrode potential OCVNeg and the SOC of the battery at the beginning of life (Beginning of Life, BOL). By comparison, it may be considered that curve 1 is obtained by scaling and then translating curve 2. In this case, the translating amount of curve 1 relative to curve 2 nay be used to represent the second aging parameter. For example, according to curve 1 and curve 2 as shown in FIG. 2, the second aging parameter may be calculated as KLL=0.1.

It should be noted that although the value of the negative electrode potential of the battery is overall small, and curve 1 and curve 2 in FIG. 2 appear to overlap almost together, but actually curve 1 is generally higher than curve 2.

Secondly, the first aging parameter may include: a positive electrode aging parameter representing an aging degree of positive electrode active material of the battery, and/or a negative electrode aging parameter representing an aging degree of negative electrode active material of the battery.

The following parts of the embodiments of the present application will describe the negative electrode aging parameter and the positive electrode aging parameter in detail with reference to FIG. 2.

1. The negative electrode aging parameter. The negative electrode aging parameter may be correlated with the negative electrode material loss.

Still referring to FIG. 2, it may be considered that curve 1 is obtained by scaling and then translating curve 2. In this case, the scaling amount of curve 1 relative to curve 2 may be used to represent the negative electrode aging parameter. For example, according to curve 1 and curve 2 as shown in FIG. 2, the negative electrode aging parameter may be calculated as Wn=0.1.

In some embodiments, the aging degree of the negative electrode material is positively correlated with the negative electrode aging parameter, that is, the greater the aging degree of the negative electrode material, the greater the negative electrode aging parameter.

2. The positive electrode aging parameter. The positive electrode aging parameter may be correlated with the positive electrode material loss.

Still referring to FIG. 2, curve 3 depicted with the dashed line is the correlation curve between the positive electrode potential OCVPos and the SOC of the battery after aging, and curve 4 depicted with the solid line is the correlation curve between the positive electrode potential OCVPos and the SOC of the battery at the beginning of life. Curve 3 is generally higher than curve 4, and by comparison, it may be considered that curve 3 is obtained by scaling curve 4. In this case, the scaling amount of curve 3 relative to curve 4 may be used to represent the positive electrode aging parameter. For example, according to curve 3 and curve 4 as shown in FIG. 2, the positive electrode aging parameter may be calculated as Wp=0.1. In addition, in FIG. 2, curve 5 depicted with the dashed line is the correlation curve between the open circuit voltage OCV and the SOC of the battery after aging, and curve 6 depicted with the solid line is the correlation curve between the open circuit voltage OCV and the SOC of the battery at the beginning of life.

In some embodiments, the aging degree of the positive electrode active material is positively correlated with the positive electrode aging parameter, that is, the greater the aging degree of the positive electrode active material, the greater the positive electrode aging parameter.

In summary, the material aging parameter may include at least one of the positive electrode aging parameter Wp, the negative electrode aging parameter Wn, and the second aging parameter KLL.

In some embodiments, the positive electrode aging parameter Wp, the negative electrode aging parameter Wn, and the second aging parameter KLL may be obtained by means of fitting.

Specifically, S110 includes step A1 to step A8 as follows.

Step A1: acquiring a plurality of sets of first pending data within a preset time period.

Firstly, in order to ensure the calculation accuracy, a plurality of sets of first pending data may be acquired within the preset time period. The preset time period may be determined according to specific requirements and actual scenarios. For example, the preset time period may be determined according to the overall aging rate of the battery, and if the aging rate of the battery is fast, the plurality of sets of the first pending data may be acquired within, for example, one week or half a month.

Secondly, each set of the first pending data includes a battery open circuit voltage (OCV) under a quasi-stationary working condition, and a cumulative net charging and discharging capacity (Q) corresponding to the OCV. If each set of the first pending data can be expressed as OCV-Q, the plurality of sets of the first pending data may be an OCV-Q sequence. Herein, the symbol "–" is used to indicate a corresponding relationship between each pair of the OCV and Q in the sequence.

In some embodiments, the plurality of sets of the first pending data may be acquired in the following two specific manners.

A first acquiring manner: a plurality of quasi-stationary working conditions may occur within the preset time period, and for each of the quasi-stationary working conditions, an OCV value may be calculated, and the cumulative net charging and discharging capacity Q during this quasi-stationary working condition is acquired. The OCV and the cumulative net charging and discharging capacity Q calculated under each of the quasi-stationary working conditions are used as a set of the first pending data.

In the first acquiring manner, a battery voltage, a battery current, and a temperature under this quasi-stationary working condition may be acquired, based on which the OCV is then calculated. For example, the battery voltage at the last moment before the end of the quasi-stationary working condition may be used as the OCV.

Herein, the cumulative net charging and discharging capacity=the cumulative charging capacity–the cumulative discharging capacity, and the cumulative net charging and discharging capacity corresponding to each of the quasi-stationary working conditions may be calculated utilizing the ampere-hour integration method. Herein, the quasi-stationary working condition refers to a working condition in which a duration during which the battery is charged with a current less than a preset current threshold reaches a first preset duration, or a current stationary duration of the battery is greater than a second preset duration.

A second acquiring manner: in the preset time period, the battery may be charged in a maintenance mode for many times, where the maintenance mode refers to charging the battery to a preset capacity. For example, in the maintenance mode, the charging is stopped when 90% of the calibrated capacity is reached, which may extend the battery life. During each maintenance mode, if an operating condition of the quasi-stationary working condition is met, the battery is controlled to operate in the quasi-stationary working condition. The operating condition of the quasi-stationary working condition includes that the battery temperature is within a specified temperature range, and the battery SOC before entering the quasi-stationary working condition is less than a certain threshold or within a certain threshold range. Herein, the specific implementation for determining the OCV and the cumulative net charging and discharging capacity Q in the quasi-stationary working condition is similar to that of the first acquiring manner, which will not be repeated herein.

Step A2: determining a first current state of charge (SOC) corresponding to a current cumulative net charging and discharging capacity Q in each set of the first pending data by use of a first corresponding relationship function of the cumulative net charging and discharging capacity Q and a current SOC, and constructing a corresponding relationship between the OCV in each set of the first pending data and the first current SOC so as to obtain a plurality of corresponding sets of the OCV and the first current SOC.

In step A2, a corresponding relationship coefficient of the cumulative net charging and discharging capacity Q and the current SOC in the first corresponding relationship function is a capacity aging parameter k. Herein, the capacity aging parameter represents the current aging degree of the battery capacity. For example, the first corresponding relationship function may be expressed as SOC=k*Q+b. It should be noted that both k and b in the first corresponding relationship function are unknown.

If the plurality of sets of the first pending data are expressed as an OCV-Q sequence, the plurality of corresponding sets of the OCV and the first current SOC may be expressed as an OCV-k*Q+b sequence. Herein, the symbol "–" is used to indicate a corresponding relationship between each pair of the OCV and k*Q+b in the sequence.

Step A3: acquiring a plurality of sets of second pending data.

In step A3, each set of the second pending data includes a positive electrode potential of the battery at a beginning of life and operating under the quasi-stationary working condition, and an initial SOC corresponding to the positive electrode potential. For example, if each set of the second pending data can be expressed as OCVp0-SOCp0, the plurality of sets of the second pending data may be expressed as an OCVp0-SOCp0 sequence.

In some embodiments, the plurality of sets of the second pending data may be determined from the correlation curve between the positive electrode potential OCVPos and the SOC of the battery at the beginning of life (for example, curve 4 in FIG. 2).

Step A4: determining a second current SOC corresponding to the initial SOC in each set of the second pending data by use of a second corresponding relationship function of the initial SOC and the current SOC, and constructing a corresponding relationship between the positive electrode potential in each set of the second pending data and the second current SOC so as to obtain a plurality of corresponding sets of the positive electrode potential and the second current SOC.

In step A4, a corresponding relationship coefficient of the initial SOC and the current SOC in the second corresponding relationship function is the positive electrode aging parameter. For example, the second corresponding relationship function may be expressed as SOCp1=SOCp0*Wp, where SOCp0 represents the initial SOC, and SOCp1 represents the current SOC. It should be noted that Wp in the second corresponding relationship function is unknown.

If the plurality of sets of the second pending data are expressed as an OCVp0-SOCp0 sequence, the plurality of corresponding sets of the positive electrode potential and the second current SOC may be represented as an OCVp0-SOCp0*Wp sequence or an OCVp0-SOCp1 sequence.

Step A5: acquiring a plurality of sets of third pending data.

In step A5, each set of the third pending data includes a negative electrode potential of the battery at the beginning of life and operating under the quasi-stationary working condition, and an initial SOC corresponding to the negative electrode potential. For example, each set of the third pending data may be expressed as OCVn0-SOCn0, and the plurality of sets of the third pending data may be an OCVn0-SOCn0 sequence.

In some embodiments, the plurality of sets of the third pending data may be determined from the correlation curve between the negative electrode potential OCVNeg and the SOC of the battery at the beginning of life (for example, curve 2 in FIG. 2).

Step A6: determining a third current SOC corresponding to the initial SOC in each set of the third pending data by use of a third corresponding relationship function of the initial SOC and the current SOC, and constructing a corresponding relationship between the negative electrode potential in each set of the third pending data and the third current SOC so as to obtain a plurality of corresponding sets of the negative electrode potential and the third current SOC.

In step A6, a corresponding relationship coefficient of the initial SOC and the current SOC in the third corresponding relationship function is the negative electrode aging parameter, and a constant term in the third corresponding relationship function is the second aging parameter. For example, the third corresponding relationship function may be expressed as $SOCn1=SOCn0*Wn+KLL$, where $SOCn0$ represents the initial SOC, and $SOCn1$ represents the current SOC.

It should be noted that the corresponding relationship coefficient Wn and the constant term KLL in the third corresponding relationship function are unknown.

If the plurality of sets of the third pending data are expressed as an $OCVn0-SOCn0$ sequence, the plurality of corresponding sets of the negative electrode potential and the third current SOC may be represented as an $OCVn0-SOCn0*Wn+KLL$ sequence or an $OCVn0-SOCn1$ sequence.

Step A7: processing the plurality of corresponding sets of the positive electrode potential and the second current SOC and the plurality of corresponding sets of the negative electrode potential and the third current SOC to obtain a plurality of corresponding sets of the OCV and a fourth current SOC.

Step A8: fitting the plurality of corresponding sets of the OCV and the first current SOC and the plurality of corresponding sets of the OCV and the fourth current SOC to obtain the capacity aging parameter k, the second aging parameter KLL, the positive electrode aging parameter Wp, and the negative electrode aging parameter Wn.

For example, for the $OCVp0-SOCp1$ sequence and the $OCVn0-SOCn1$ sequence, the SOCp1 and SOCn1 are normalized to obtain an $OCVp0'-SOCp1'$ sequence and an $OCVn0'-SOCn1'$ sequence. Since the battery open circuit voltage is equal to a difference between the battery positive electrode potential and the battery negative electrode potential, $OCV'=OCVp0'-OCVn0'$, an $OCV'-SOC'$ may be generated with the $OCVp0'-SOCp1'$ sequence and the $OCVn0'-SOCn1'$ sequence.

Since the $OCV'-SOC'$ sequence is used to reflect a first fitting corresponding relationship between the current OCV and SOC of the battery and contains unknown KLL, Wp, and Wn, and the $OCV-k*Q+b$ sequence is used to reflect a second fitting corresponding relationship between the current OCV and SOC of the battery and contains unknown k, these two sequences may be fitted to obtain the specific values of KLL, Wp, Wn, and k.

S120: determining, based on a preset corresponding relationship between the material aging parameter and the battery remaining life, the battery remaining life corresponding to the material aging parameter.

Firstly, the preset corresponding relationship between the material aging parameter and the battery remaining life may be implemented as a correlation curve or a plurality of corresponding data, such as a plurality of pairs of material aging parameter-battery remaining life in the form of key values. For example, the corresponding relationship between the material aging parameter and the battery remaining life may be experimentally measured.

In some embodiments, the preset corresponding relationship between the material aging parameter and the battery remaining life may include: a first corresponding relationship between the material aging parameter and a material concentration change, and a second corresponding relationship between the material concentration change and the battery remaining life.

Figure 3:
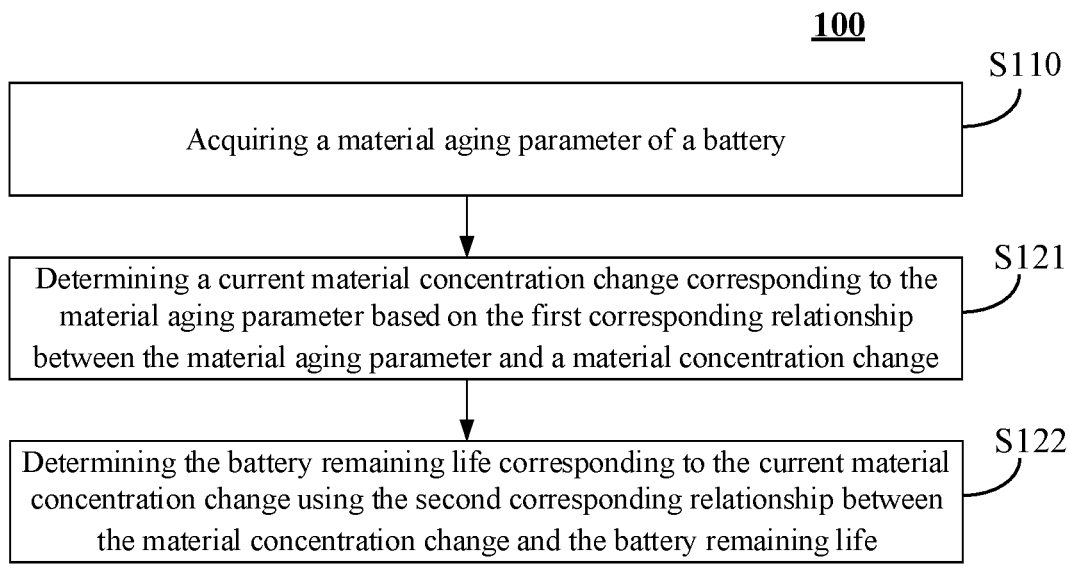
FIG. 3 is a schematic flowchart of an exemplary method for estimating a battery remaining life provided by the embodiments of the present application.

Accordingly, FIG. 3 is a schematic flowchart of an exemplary method for estimating a battery remaining life provided by the embodiments of the present application. As shown in FIG. 3, the specific implementation of S120 may include S121 and S122.

S121: determining a current material concentration change corresponding to the material aging parameter based on the first corresponding relationship between the material aging parameter and the material concentration change.

The first corresponding relationship may be experimentally measured. The specific form of the first corresponding relationship may refer to the specific form of the preset corresponding relationship between the material aging parameter and the battery remaining life, which will not be repeated herein.

The current material concentration change is equal to a difference between the initial material concentration and the current material concentration. Herein, the initial material concentration is the material concentration of the battery at the beginning of life.

It should be noted that if the specific type of the material aging parameter is different, the specific content of the first corresponding relationship illustrated in the above embodiments of the present application is also different. For example, if the material aging parameter includes the second aging parameter and the positive electrode aging parameter, the first corresponding relationship may include a first sub-corresponding relationship between the second aging parameter and the concentration change of active ions, and a second sub-corresponding relationship between the positive electrode aging parameter and the concentration change of positive electrode active material.

S122: determining the battery remaining life corresponding to the current material concentration change using the second corresponding relationship between the material concentration change and the battery remaining life.

The second corresponding relationship may be experimentally measured. The specific form of the second corresponding relationship may refer to the specific form of the preset corresponding relationship between the material aging parameter and the battery remaining life, which will not be repeated herein.

Firstly, the battery remaining life is discussed. In some embodiments, the battery remaining life may be specifically expressed in the form of a percentage, and the greater the percentage, the longer the remaining life. For example, the battery remaining life of a newly made battery may be set to 100%, and the battery remaining life of an out-of-use battery may be set to 0%. Alternatively, the battery remaining life may be expressed in the form of, but not limited to, remaining service life, remaining charge and discharge cycles or the like.

In some embodiments, the battery remaining life in S120 is related to the specific type of the material aging parameter.

Specifically, under a condition that the material aging parameter includes the positive electrode aging parameter, the battery remaining life includes a current remaining life of the positive electrode active material.

Under a condition that the material aging parameter includes the negative electrode aging parameter, the battery remaining life includes a current remaining life of the negative electrode active material.

Under a condition that the material aging parameter includes the second aging parameter, the battery remaining life includes a current remaining life of the active ions.

Finally, the corresponding relationship between the material aging parameter and the battery remaining life is discussed.

In a first case, the material aging parameter includes one aging parameter among the positive electrode aging parameter, the negative electrode aging parameter, and the second aging parameter, and then the battery remaining life may be determined as the current remaining life corresponding to this aging parameter.

For example, if the material aging parameter includes the negative electrode aging parameter, the battery remaining life is the current remaining life of the negative electrode active material.

In a second case, the material aging parameter includes at least two aging parameters among the positive electrode aging parameter, the negative electrode aging parameter, and the second aging parameter.

In such a case, determining the battery remaining life may include: determining the battery remaining life as a minimum value of current remaining lives respectively corresponding to the at least two aging parameters.

For example, if the material aging parameter includes the positive electrode aging parameter, the negative electrode aging parameter, and the second aging parameter, and the current remaining life of the positive electrode active material is 52%, the current remaining life of the negative electrode active material is 48%, and the current remaining life of the active ions is 26%, then the battery remaining life is 26%.

In the second case, the applicant considers that the battery remaining life generally depends on the material with the greatest aging degree, thus by determining the battery remaining life as the minimum value of current remaining lives respectively corresponding to the at least two aging parameters, the battery remaining life can be accurately measured.

According to the method for estimating a battery remaining life of the embodiments of the present application, the corresponding relationship between the material aging parameter and the battery remaining life may be preset, and the battery remaining life corresponding to the acquired material aging parameter of the individual battery may be determined based on this corresponding relationship. Since the battery remaining life gradually decreases after the battery is put into use, and during the decreasing of the battery remaining life, the battery material will also age, the material aging parameter reflecting the aging degree of the individual battery material is used to evaluate the battery remaining life of the individual battery, and the estimation accuracy of the battery remaining life is improved.

Based on the same application concept, in addition to the method for estimating the battery remaining life, the embodiments of the present application also provide an apparatus for estimating a battery remaining life corresponding to the method. The apparatus according to the embodiment of the present application will be described in detail below with reference to the drawings.

Figure 4:
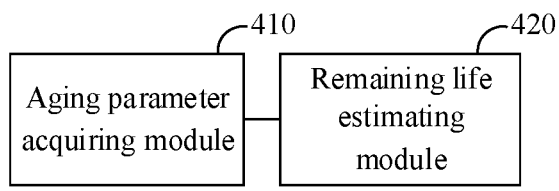
FIG. 4 is a structural diagram of an apparatus for estimating a battery remaining life provided by the embodiments of the present application.

The embodiments of the present application provide an apparatus for estimating a battery remaining life. FIG. 4 is a structural diagram of the apparatus for estimating a battery remaining life provided by the embodiments of the present application. As shown in FIG. 4, the apparatus for estimating a battery remaining life 400 includes an aging parameter acquiring module 410 and a remaining life estimating module 420.

Herein, the aging parameter acquiring module 410 is configured to acquire a material aging parameter of a battery representing an aging degree of a material of the battery.

The remaining life estimating module 420 is configured to determine, based on a preset corresponding relationship between the material aging parameter and the battery remaining life, the battery remaining life corresponding to the material aging parameter.

In some embodiments, the corresponding relationship includes: a first corresponding relationship between the material aging parameter and a material concentration change, and a second corresponding relationship between the material concentration change and the battery remaining life.

Accordingly, the remaining life estimating module 420 includes:

a first determining unit configured to determine a current material concentration change corresponding to the material aging parameter based on the first corresponding relationship; and a second determining unit configured to determine the battery remaining life corresponding to the current material concentration change using the second corresponding relationship.

In some embodiments, the material aging parameter includes: a first aging parameter representing an aging degree of electrode active material of the battery, and/or a second aging parameter representing an aging degree of active ions of the battery.

Herein, the first aging parameter includes: a positive electrode aging parameter representing an aging degree of positive electrode active material of the battery, and/or a negative electrode aging parameter representing an aging degree of negative electrode active material of the battery.

In some embodiments, under a condition that the material aging parameter includes the positive electrode aging parameter, the battery remaining life includes a current remaining life of the positive electrode active material.

Under a condition that the material aging parameter includes the negative electrode aging parameter, the battery remaining life includes a current remaining life of the negative electrode active material.

Under a condition that the material aging parameter includes the second aging parameter, the battery remaining life includes a current remaining life of the active ions.

In some embodiments, the material aging parameter includes at least two aging parameters among the positive electrode aging parameter, the negative electrode aging parameter, and the second aging parameter.

Accordingly, the remaining life estimating module 420 is configured to: determine the battery remaining life as a minimum value of current remaining lives respectively corresponding to the at least two aging parameters.

In some embodiments, the material aging parameter includes the positive electrode aging parameter representing the aging degree of positive electrode active material of the battery, the negative electrode aging parameter representing the aging degree of negative electrode active material of the battery, and the second aging parameter representing the aging degree of active ions of the battery.

The aging parameter acquiring module 410 includes:

a first acquiring unit configured to acquire a plurality of sets of first pending data within a preset time period, in which each set of the first pending data includes a battery open circuit voltage (OCV) under a quasi-stationary working condition, and a cumulative net charging and discharging capacity Q corresponding to the OCV;

a first calculating unit configured to determine a first current state of charge (SOC) corresponding to a current Q in each set of the first pending data by use of a first corresponding relationship function of the cumulative net charging and discharging capacity Q and a current SOC and construct a corresponding relationship between the OCV in each set of the first pending data and the first current SOC so as to obtain a plurality of corresponding sets of the OCV and the first current SOC, in which a corresponding relationship coefficient of the cumulative net charging and discharging capacity Q and the current SOC in the first corresponding relationship function is a capacity aging parameter;

a second acquiring unit configured to acquire a plurality of sets of second pending data, in which each set of the second pending data includes a positive electrode potential of the battery at a beginning of life and operating under the quasi-stationary working condition, and an initial SOC corresponding to the positive electrode potential;

a second calculating unit configured to determine a second current SOC corresponding to the initial SOC in each set of the second pending data by use of a second corresponding relationship function of the initial SOC and the current SOC, and construct a corresponding relationship between the positive electrode potential in each set of the second pending data and the second current SOC so as to obtain a plurality of corresponding sets of the positive electrode potential and the second current SOC, in which a corresponding relationship coefficient of the initial SOC and the current SOC in the second corresponding relationship function is the positive electrode aging parameter;

a third acquiring unit configured to acquire a plurality of sets of third pending data, in which each set of the third pending data includes a negative electrode potential of the battery at the beginning of life and operating under the quasi-stationary working condition, and an initial SOC corresponding to the negative electrode potential;

a third calculating unit configured to determine a third current SOC corresponding to the initial SOC in each set of the third pending data by use of a third corresponding relationship function of the initial SOC and the current SOC, and construct a corresponding relationship between the negative electrode potential in each set of the third pending data and the third current SOC so as to obtain a plurality of corresponding sets of the negative electrode potential and the third current SOC, in which a corresponding relationship coefficient of the initial SOC and the current SOC in the third corresponding relationship function is the negative electrode aging parameter, and a constant term in the third corresponding relationship function is the second aging parameter;

a fourth calculating unit configured to process the plurality of corresponding sets of the positive electrode potential and the second current SOC and the plurality of corresponding sets of the negative electrode potential and the third current SOC to obtain a plurality of corresponding sets of the OCV and a fourth current SOC; and a fitting unit configured to fit the plurality of corresponding sets of the OCV and the first current SOC and the plurality of corresponding sets of the OCV and the fourth current SOC to obtain the capacity aging parameter, the second aging parameter, the positive electrode aging parameter, and the negative electrode aging parameter, in which the quasi-stationary working condition includes a working condition in which a duration during which the battery is charged with a current less than a preset current threshold reaches a first preset duration, or a current stationary duration of the battery is greater than a second preset duration.

According to the apparatus for estimating a battery remaining life of the embodiments of the present application, the corresponding relationship between the material aging parameter and the battery remaining life may be preset, and the battery remaining life corresponding to the acquired material aging parameter of the individual battery may be determined based on this corresponding relationship. Since the battery remaining life gradually decreases after the battery is put into use, and during the decreasing of the battery remaining life, the battery material will also age, the material aging parameter reflecting the aging degree of the individual battery material is used to evaluate the battery remaining life of the individual battery, and the estimation accuracy of the battery remaining life is improved.

Other details of the apparatus for estimating the battery remaining life according to the embodiment of the present application are similar to those of the method for estimating the battery remaining life described above with reference to the examples shown in FIGS. 1-3, and corresponding technical effects can be achieved, which will not be repeated herein for clarity.

Figure 5:
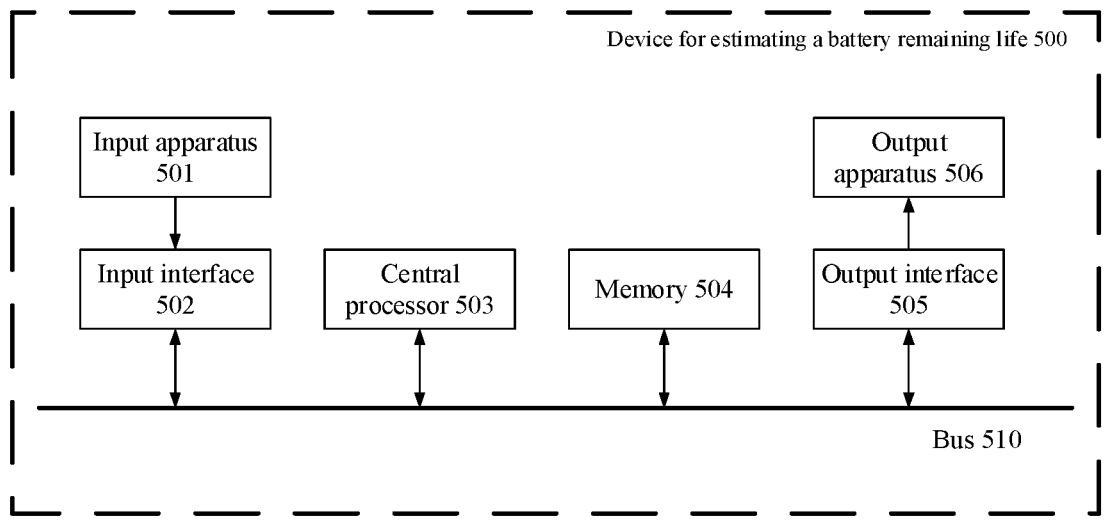
FIG. 5 is a structural diagram of an exemplary hardware architecture of a device for estimating a battery remaining life in the embodiments of the present application.

FIG. 5 is a structural diagram of an exemplary hardware architecture of a device for estimating a battery remaining life in the embodiments of the present application.

As shown in FIG. 5, the device for estimating the battery remaining life 500 includes an input apparatus 501, an input interface 502, a central processor 503, a memory 504, an output interface 505, and an output apparatus 506. Herein, the input interface 502, the central processor 503, the memory 504, and the output interface 505 are connected to each other via a bus 510, and the input apparatus 501 and the output apparatus 506 are connected to the bus 510 through the input interface 502 and the output interface 505, respectively, and in turn connected to other components of the device for estimating the battery remaining life 500.

Specifically, the input apparatus 501 receives input information from the outside, and transmits the input information to the central processor 503 through the input interface 502; the central processor 503 processes the input information based on the computer executable instructions stored in the memory 504 to generate output information, stores the output information in the memory 504 temporarily or permanently, and then transmits the output information to the output apparatus 506 through the output interface 505; and the output apparatus 506 outputs the output information out of the device for estimating the battery remaining life 500 for users to use.

That is, the device for estimating the battery remaining life as shown in FIG. 5 may also be implemented as including: a memory storing computer-executable instructions; and a processor which may implement, when executing the computer-executable instructions, the method for estimating the battery remaining life described with reference to FIGS. 1-3.

In an embodiment, the device for estimating the battery remaining life 500 as shown in FIG. 5 may be implemented as a device which may include: a memory storing a program; and a processor configured to operate the program stored in the memory to perform the method for estimating the battery remaining life of the embodiments of the present application.

The embodiments of the present application also provide a computer storage medium storing computer program instructions thereon which implement, when executed by a processor, the method for estimating the battery remaining life of the embodiments of the present application.

It should be noted that the present application is not limited to the specific configurations and processes described above and shown in the drawings. For simplicity, a detailed descriptions of well-known methods are omitted herein. In the above embodiments, several specific steps are described and shown as examples. However, the flow of the methods of the present application is not limited to the specific steps described and shown, and those skilled in the art can make various changes, modifications and additions, or change the order of the steps, after understanding the gist of the present application.

Functional blocks shown in the above structural diagrams may be implemented as hardware, software, firmware, or a combination thereof. When implemented in hardware, the functional blocks may be, for example, an electronic circuit, an Application Specific Integrated Circuit (ASIC), a suitable firmware, a plug-in, a function card and the like. When implemented in software, elements of the present disclosure may be programs or code segments used to perform the required tasks. The programs or code segments may be stored in a machine-readable medium or transmitted over a transmission medium or a communication link via data signals carried in carriers. The "machine-readable medium" may include any medium capable of storing or transmitting information. Examples of the machine-readable medium may include an electronic circuit, a semiconductor memory device, a ROM, a flash memory, an erasable ROM (EROM), a floppy disk, a CD-ROM, an optical disk, a hard disk, a fiber medium, a Radio Frequency (RF) link, and the like. The code segments may be downloaded via a computer network such as the Internet, an intranet. In the embodiments of the present application, the computer-readable storage medium refers to a non-transitory readable medium.

The above are merely specific implementations of the present application, and those skilled in the art may explicitly appreciate that for convenience and conciseness of the descriptions, the specific working process of the above systems, modules and units may refer to corresponding processes in the forgoing method embodiments, which will not be repeated herein.

What is claimed is:

1. A method for estimating a battery remaining life, comprising:
    detecting a positive electrode potential, a negative electrode potential, and a state of charge (SOC) of a battery at a beginning of life (BOL) and after aging;
    generating correlation curves between the negative electrode potential and the SOC of the battery at the BOL and after aging, and correlation curves between the positive electrode potential and the SOC of the battery at the BOL and after aging;
    acquiring, based on the generated correlation curves, a material aging parameter of the battery representing an aging degree of a material of the battery;
    determining, based on a preset corresponding relationship between the material aging parameter and the battery remaining life, the battery remaining life corresponding to the material aging parameter; and
    outputting the determined battery remaining life for users to use;
    wherein the material aging parameter comprises:
    a first aging parameter representing an aging degree of electrode active material of the battery, and
    a second aging parameter representing an aging degree of active ions of the battery;
    wherein the first aging parameter comprises:
    a positive electrode aging parameter representing an aging degree of positive electrode active material of the battery, and a negative electrode aging parameter representing an aging degree of negative electrode active material of the battery;
    the acquiring the material aging parameter of the battery comprises:
    acquiring a plurality of sets of first pending data within a preset time period, wherein each set of the first pending data comprises a battery open circuit voltage (OCV) under a quasi-stationary working condition, and a cumulative net charging and discharging capacity (Q) corresponding to the OCV;
    determining a first current state of charge (SOC) corresponding to a current Q in each set of the first pending data by use of a first corresponding relationship function of the Q and a current SOC, and constructing a corresponding relationship between the OCV in each set of the first pending data and the first current SOC so as to obtain a plurality of corresponding sets of the OCV and the first current SOC, wherein a corresponding relationship coefficient of the Q and the current SOC in the first corresponding relationship function is a capacity aging parameter;
    acquiring a plurality of sets of second pending data, wherein each set of the second pending data comprises a positive electrode potential of the battery at a beginning of life and operating under the quasi-stationary working condition, and an initial SOC corresponding to the positive electrode potential;
    determining a second current SOC corresponding to the initial SOC in each set of the second pending data by use of a second corresponding relationship function of the initial SOC and the current SOC, and constructing a corresponding relationship between the positive electrode potential in each set of the second pending data and the second current SOC so as to obtain a plurality of corresponding sets of the positive electrode potential and the second current SOC, wherein a corresponding relationship coefficient of the initial SOC and the current SOC in the second corresponding relationship function is the positive electrode aging parameter;
    acquiring a plurality of sets of third pending data, wherein each set of the third pending data comprises a negative electrode potential of the battery at the beginning of life and operating under the quasi-stationary working condition, and an initial SOC corresponding to the negative electrode potential;
    determining a third current SOC corresponding to the initial SOC in each set of the third pending data by use of a third corresponding relationship function of the initial SOC and the current SOC, and constructing a corresponding relationship between the negative electrode potential in each set of the third pending data and the third current SOC so as to obtain a plurality of corresponding sets of the negative electrode potential and the third current SOC, wherein a corresponding relationship coefficient of the initial SOC and the current SOC in the third corresponding relationship function is the negative electrode aging parameter, and a constant term in the third corresponding relationship function is the second aging parameter;
    processing the plurality of corresponding sets of the positive electrode potential and the second current SOC and the plurality of corresponding sets of the negative electrode potential and the third current SOC to obtain a plurality of corresponding sets of the OCV and a fourth current SOC; and fitting the plurality of corresponding sets of the OCV and the first current SOC and the plurality of corresponding sets of the OCV and the fourth current SOC to obtain the capacity aging parameter, the second aging parameter, the positive electrode aging parameter, and the negative electrode aging parameter;

wherein the quasi-stationary working condition comprises a working condition in which a duration during which the battery is charged with a current less than a preset current threshold reaches a first preset duration.

2. The method for estimating a battery remaining life according to claim 1, wherein under a condition that the material aging parameter comprises the positive electrode aging parameter, the battery remaining life comprises a current remaining life of the positive electrode active material;

under a condition that the material aging parameter comprises the negative electrode aging parameter, the battery remaining life comprises a current remaining life of the negative electrode active material; and under a condition that the material aging parameter comprises the second aging parameter, the battery remaining life comprises a current remaining life of the active ions.

3. The method for estimating a battery remaining life according to claim 2, wherein the material aging parameter comprises at least two aging parameters among the positive electrode aging parameter, the negative electrode aging parameter, and the second aging parameter;

the determining, based on the preset corresponding relationship between the material aging parameter and the battery remaining life, the battery remaining life corresponding to the material aging parameter comprises:

determining the battery remaining life as a minimum value of current remaining lives respectively corresponding to the at least two aging parameters.

4. The method for estimating a battery remaining life according to claim 1, wherein the material aging parameter comprises at least two aging parameters among the positive electrode aging parameter, the negative electrode aging parameter, and the second aging parameter;

the determining, based on the preset corresponding relationship between the material aging parameter and the battery remaining life, the battery remaining life corresponding to the material aging parameter comprises:

determining the battery remaining life as a minimum value of current remaining lives respectively corresponding to the at least two aging parameters.

5. A non-transitory computer storage medium storing computer program instructions thereon which implement, when executed by a processor, the method for estimating a battery remaining life according to claim 1.

6. The method for estimating a battery remaining life according to claim 1, wherein the preset corresponding relationship comprises: a first corresponding relationship between the material aging parameter and a material concentration change, and a second corresponding relationship between the material concentration change and the battery remaining life, the determining, based on the preset corresponding relationship between the material aging parameter and the battery remaining life, the battery remaining life corresponding to the acquired material aging parameter comprises:

determining a current material concentration change corresponding to the material aging parameter based on the first corresponding relationship; and determining the battery remaining life corresponding to the current material concentration change using the second corresponding relationship.

7. A device for estimating a battery remaining life, comprising:

an input apparatus;

an output apparatus;

a memory storing a program; and a processor coupled to the input apparatus, the output apparatus and the memory and configured to operate the program stored in the memory to:

obtain, via the input apparatus, a positive electrode potential, a negative electrode potential, and a state of charge (SOC) of a battery detected at a beginning of life (BOL) and after aging;

generate correlation curves between the negative electrode potential and the SOC of the battery at the BOL and after aging, and correlation curves between the positive electrode potential and the SOC of the battery at the BOL and after aging;

acquire, based on the generated correlation curves, a material aging parameter of the battery representing an aging degree of a material of the battery;

determine, based on a preset corresponding relationship between the material aging parameter and the battery remaining life, the battery remaining life corresponding to the material aging parameter; and output, via the output apparatus, the determined battery remaining life for users to use;

wherein the material aging parameter comprises:

a first aging parameter representing an aging degree of electrode active material of the battery, and a second aging parameter representing an aging degree of active ions of the battery;

wherein the first aging parameter comprises:

a positive electrode aging parameter representing an aging degree of positive electrode active material of the battery, and a negative electrode aging parameter representing an aging degree of negative electrode active material of the battery;

the processor is configured to acquire the material aging parameter of the battery by:

acquiring a plurality of sets of first pending data within a preset time period, wherein each set of the first pending data comprises a battery open circuit voltage (OCV) under a quasi-stationary working condition, and a cumulative net charging and discharging capacity (Q) corresponding to the OCV;

determining a first current state of charge (SOC) corresponding to a current Q in each set of the first pending data by use of a first corresponding relationship function of the Q and a current SOC, and constructing a corresponding relationship between the OCV in each set of the first pending data and the first current SOC so as to obtain a plurality of corresponding sets of the OCV and the first current SOC, wherein a corresponding relationship coefficient of the Q and the current SOC in the first corresponding relationship function is a capacity aging parameter;

acquiring a plurality of sets of second pending data, wherein each set of the second pending data comprises a positive electrode potential of the battery at a beginning of life and operating under the quasi-stationary working condition, and an initial SOC corresponding to the positive electrode potential;

determining a second current SOC corresponding to the initial SOC in each set of the second pending data by use of a second corresponding relationship function of the initial SOC and the current SOC, and constructing a corresponding relationship between the positive electrode potential in each set of the second pending data and the second current SOC so as to obtain a plurality of corresponding sets of the positive electrode potential and the second current SOC, wherein a corresponding relationship coefficient of the initial SOC and the current SOC in the second corresponding relationship function is the positive electrode aging parameter;

acquiring a plurality of sets of third pending data, wherein each set of the third pending data comprises a negative electrode potential of the battery at the beginning of life and operating under the quasi-stationary working condition, and an initial SOC corresponding to the negative electrode potential;

determining a third current SOC corresponding to the initial SOC in each set of the third pending data by use of a third corresponding relationship function of the initial SOC and the current SOC, and constructing a corresponding relationship between the negative electrode potential in each set of the third pending data and the third current SOC so as to obtain a plurality of corresponding sets of the negative electrode potential and the third current SOC, wherein a corresponding relationship coefficient of the initial SOC and the current SOC in the third corresponding relationship function is the negative electrode aging parameter, and a constant term in the third corresponding relationship function is the second aging parameter;

processing the plurality of corresponding sets of the positive electrode potential and the second current SOC and the plurality of corresponding sets of the negative electrode potential and the third current SOC to obtain a plurality of corresponding sets of the OCV and a fourth current SOC; and fitting the plurality of corresponding sets of the OCV and the first current SOC and the plurality of corresponding sets of the OCV and the fourth current SOC to obtain the capacity aging parameter, the second aging parameter, the positive electrode aging parameter, and the negative electrode aging parameter;

wherein the quasi-stationary working condition comprises a working condition in which a duration during which the battery is charged with a current less than a preset current threshold reaches a first preset duration.

8. The device for estimating a battery remaining life according to claim 7, wherein
under a condition that the material aging parameter comprises the positive electrode aging parameter, the battery remaining life comprises a current remaining life of the positive electrode active material;
under a condition that the material aging parameter comprises the negative electrode aging parameter, the battery remaining life comprises a current remaining life of the negative electrode active material; and
under a condition that the material aging parameter comprises the second aging parameter, the battery remaining life comprises a current remaining life of the active ions.

9. The device for estimating a battery remaining life according to claim 8, wherein
the material aging parameter comprises at least two aging parameters among the positive electrode aging parameter, the negative electrode aging parameter, and the second aging parameter;
the processor is configured to determine the battery remaining life by:
determining the battery remaining life as a minimum value of current remaining lives respectively corresponding to the at least two aging parameters.

10. The device for estimating a battery remaining life according to claim 7, wherein
the material aging parameter comprises at least two aging parameters among the positive electrode aging parameter, the negative electrode aging parameter, and the second aging parameter;
the processor is configured to determine the battery remaining life by:
determining the battery remaining life as a minimum value of current remaining lives respectively corresponding to the at least two aging parameters.

11. The device for estimating a battery remaining life according to claim 7, wherein the preset corresponding relationship comprises: a first corresponding relationship between the material aging parameter and a material concentration change, and a second corresponding relationship between the material concentration change and the battery remaining life,
the processor is configured to determine the battery remaining life by:
determining a current material concentration change corresponding to the material aging parameter based on the first corresponding relationship; and
determining the battery remaining life corresponding to the current material concentration change using the second corresponding relationship.

* * * * *